(12) United States Patent
Jenq et al.

(10) Patent No.: US 7,199,424 B2
(45) Date of Patent: *Apr. 3, 2007

(54) SCALABLE FLASH EEPROM MEMORY CELL WITH NOTCHED FLOATING GATE AND GRADED SOURCE REGION

(75) Inventors: Ching-Shi Jenq, Los Altos Hills, CA (US); Ting P. Yen, Saratoga, CA (US)

(73) Assignee: Integrated Memory Technologies, Inc., Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 11/338,121

(22) Filed: Jan. 23, 2006

(65) Prior Publication Data

US 2006/0131639 A1 Jun. 22, 2006

Related U.S. Application Data

(63) Continuation of application No. 10/878,099, filed on Jun. 28, 2004, now Pat. No. 7,009,244.

(60) Provisional application No. 60/484,882, filed on Jul. 2, 2003.

(51) Int. Cl.
| H01L 29/788 | (2006.01) |
| H01L 29/76 | (2006.01) |
| G11C 11/34 | (2006.01) |
| G11C 16/04 | (2006.01) |

(52) U.S. Cl. ............... 257/316; 257/317; 257/318; 257/319; 257/320; 257/321; 365/185.1; 365/185.14; 365/185.15; 365/185.11

(58) Field of Classification Search ............... 257/316, 257/317, 318, 319, 320, 321; 365/185.1, 365/185.14, 185.15, 185.11

See application file for complete search history.

(56) References Cited

U.S. PATENT DOCUMENTS

| 4,462,090 | A | 7/1984 | Iizuka |
| 4,698,787 | A | 10/1987 | Mukherjee et al. |
| 5,029,130 | A | 7/1991 | Yeh |
| 5,194,925 | A | 3/1993 | Ajika et al. |
| 5,280,446 | A | 1/1994 | Ma et al. |
| 5,303,187 | A | 4/1994 | Yu |
| 5,338,952 | A | 8/1994 | Yamauchi |
| 5,414,286 | A | 5/1995 | Yamauchi |
| 5,475,634 | A | 12/1995 | Wang et al. |

(Continued)

*Primary Examiner*—Howard Weiss
*Assistant Examiner*—Shrinivas H. Rao
(74) *Attorney, Agent, or Firm*—DLA Piper US LLP

(57) ABSTRACT

An memory device, and method of making same, that includes source and drain regions defining a channel region therebetween. A select gate is formed over and insulated from a first portion of the channel region. A conductive floating gate is disposed over and insulated from the source region and a second portion of the channel region. A notch is formed in the floating gate bottom surface having an edge that is either aligned with an edge of the source region or is disposed over the source region. A conductive control gate is disposed adjacent to the floating gate. By having the source region terminate under the thicker insulation region provided by the notch, the breakdown voltage of the source junction is increased. Alternately, the lower portion of the floating gate is formed entirely over the source region, for producing fringing fields to control the adjacent portion of the channel region.

14 Claims, 7 Drawing Sheets

U.S. PATENT DOCUMENTS

| | | |
|---|---|---|
| 5,668,757 A | 9/1997 | Jenq |
| 5,854,507 A | 12/1998 | Miremadi et al. |
| 5,856,943 A | 1/1999 | Jenq |
| 5,912,843 A | 6/1999 | Jenq |
| 6,091,104 A | 7/2000 | Chen |
| 6,414,350 B1 | 7/2002 | Hsieh et al. |
| 6,483,718 B2 | 11/2002 | Hashimoto |
| 6,583,503 B2 | 6/2003 | Akram et al. |
| 6,621,115 B2 | 9/2003 | Jenq et al. |
| 6,624,465 B1 | 9/2003 | Chien et al. |
| 6,686,656 B1 | 2/2004 | Koh et al. |
| 6,747,310 B2 | 6/2004 | Fan et al. |
| 6,855,980 B2 | 2/2005 | Wang et al. |
| 6,868,015 B2 | 3/2005 | Wang |
| 2004/0130947 A1 | 7/2004 | Fan et al. |

# SCALABLE FLASH EEPROM MEMORY CELL WITH NOTCHED FLOATING GATE AND GRADED SOURCE REGION

This application is a continuation of U.S. patent application Ser. No. 10/878,099, filed Jun. 28, 2004 now U.S. Pat. No. 7,009,244.

This application claims the benefit of U.S. Provisional Application No. 60/484,882, filed Jul. 2, 2003.

TECHNICAL FIELD

The present invention relates to an electrically erasable and programmable read-only non-volatile memory (EEPROM) cell or, more specifically, a flash EEPROM. The present invention also relates to a memory array containing a plurality of such EEPROM cells arranged in a matrix of rows and columns of such memory cells.

BACKGROUND OF THE INVENTION

One prior art flash memory device is a stack gate flash EEPROM where a single. stack-gate transistor constitutes the memory cell. It programs as a traditional UV-erasable EPROM, using the mechanism of hot-electron injection to a floating gate, and erases through Fowler-Nordheim tunneling mechanism from the floating gate to the source region. Such device suffers the disadvantages of (1) over-erase sensitivity, where the memory cell can be erased to a negative threshold voltage thus rendering the cell in a conductive state even when the gate of the cell is deselected and biased at a ground potential, and (2) high programming current, which requires the memory cell to be programmed by a separate power supply voltage. See for example, U.S. Pat. No. 4,698,787.

A second type of flash memory device utilizes a split gate configuration. This eliminates the over-erase sensitivity, because even if the floating gate is over-erased, conduction in the channel requires the biasing of the control gate which is over another portion of the channel. However, the programming and erase mechanisms are the same as the stack-gate configuration. The disadvantage of this configuration is that it increases the cell size and can suffer an alignment sensitivity because of the split gate arrangement. See for example, U.S. Pat. No. 5,029,130.

Yet another type of flash memory cell utilizes the so called source-side injection technique which minimizes the hot electron programming current to the extent that an on-chip voltage multiplier can be used to provide sufficient programming current from a single 5 or 3.3 V power supply. However, the structure of these cells can still suffer from (1) alignment sensitivity, (2) poor scalability and (3) compromise between cell size and coupling ratio. See for example U.S. Pat. No. 5,194,925.

U.S. Pat. Nos. 5,303,187, 4,462,090 and 5,280,446 disclose a single transistor memory cell having four terminals with a select gate, a control gate, a source and a drain. The memory cell disclosed in U.S. Pat. No. 5,303,187, however, erases by tunneling of electrons from a floating gate to the substrate (see Col. 5, line 64–68). This is undesirable because of the lower coupling ratio, due to the large capacitance between the floating gate and the substrate. As a result, a higher voltage to erase is required. In addition, it requires a negative voltage to supply the potential for erase operation of an n-type cell. This requires the process to provide a high PMOS junction breakdown voltage, and a high field isolation threshold voltage and a low PMOS transistor body effect so that the circuit can provide a negative voltage of sufficient magnitude to achieve the necessary erase operation.

Each of U.S. Pat. No. 4,462,090 and 5,280,446 discloses a split gate configuration for the select gate. Such a split gate configuration for the select gate can cause punch through sensitivity due to misalignment.

U.S. Pat. No. 5,338,952 discloses a split gate memory cell with a floating gate formed as a spacer that is disposed adjacent the select gate and underneath the control gate. With this configuration, however, there is an insufficient amount of capacitive coupling between the floating gate and the control gate.

Lastly, the forgoing designs can suffer either avalanche or band-to-band breakdown during the erase operation where the source junction is biased to a relatively high potential. The breakdown voltage critically depends on the junction curvature as well as the oxide thickness at the edge of the junction. As cells are scaled down in size, the extent of curvature optimization is limited because of the reduced thermal cycles in the scaled technology.

SUMMARY OF THE INVENTION

The present invention is an electrically erasable and programmable memory device that includes a substrate of semiconductor material of a first conductivity type, spaced-apart first and second regions formed in the substrate and having a second conductivity type different from the first conductivity type, with a channel region therebetween, a conductive select gate formed over and insulated from a first portion of the channel region, a conductive floating gate having a bottom surface disposed over and insulated from the first region and a second portion of the channel region by insulation material, wherein a notch is formed in the bottom surface having an edge that is aligned with an edge of the first region or that is disposed over the first region, and a conductive control gate having a first portion disposed adjacent to the floating gate.

In another aspect of the present invention, the electrically erasable and programmable memory device includes a substrate of semiconductor material of a first conductivity type, spaced-apart first and second regions formed in the substrate and having a second conductivity type different from the first conductivity type, with a channel region. therebetween, wherein the channel region includes a first portion adjacent the first region and a second portion adjacent the second region, a conductive select gate formed over and insulated from the channel region second portion for controlling a conductivity of the channel region second portion, a conductive floating gate having a first portion disposed entirely over and insulated from the first region for generating fringing fields that control a conductivity of the channel region first portion, wherein the floating gate first portion including a bottom surface disposed entirely over and insulated from the first region and a side surface extending from the bottom surface and away from the substrate, and a conductive control gate having a first portion disposed adjacent to the floating gate.

Another aspect of the present invention is a method of making a memory device on a semiconductor substrate of a first conductivity type, including forming spaced-apart first and second regions in the substrate that have a second conductivity type different from the first conductivity type, wherein a channel region is defined in the substrate between the first and second regions, forming a conductive select gate over and insulated from a first portion of the channel region, forming a conductive floating gate having a bottom surface disposed over and insulated from the first region and a second portion of the channel region, wherein the floating gate formation includes forming a notch in the bottom surface having an edge that is aligned with an edge of the first region or that is disposed over the first region, and forming a conductive control gate having a first portion disposed adjacent to the floating gate.

In yet one more aspect of the present invention, the method of the memory device includes forming spaced-apart first and second regions in the substrate that have a second conductivity type different from the first conductivity type, wherein a channel region is defined in the substrate between the first and second regions, and wherein the channel region includes a first portion adjacent the first region and a second portion adjacent the second region, forming a conductive select gate over and insulated from the channel region second portion for controlling a conductivity of the channel region second portion, forming a conductive floating gate having a first portion disposed entirely over and insulated from the first region for generating fringing fields that control a conductivity of the channel region first portion, wherein the floating gate first portion including a bottom surface disposed entirely over and insulated from the first region and a side surface extending from the bottom surface and away from the substrate, and forming a conductive control gate having a first portion disposed adjacent to the floating gate.

Other objects and features of the present invention will become apparent by a review of the specification, claims and appended figures.

DETAILED DESCRIPTION OF THE PREFERRED EMBODIMENTS

Memory Cell Fabrication

FIGS. 1A to 1E illustrate a method of fabricating a non-volatile memory cell according to the present invention. The parameters described hereinafter depend upon the design rules and the process technology generation. It will be understood by those skilled in the art that the present invention is not limited to any specific process technology generation, nor to any specific value in any of the process parameters described hereinafter. In addition, the following method description focuses on the formation of a single memory cell, when in fact a plurality of such cells are formed simultaneously that extend end to end in active regions arranged in columns. Columns of such memory cells are separated by columns of insulation areas, the formation of which is well known in the art.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed therebetween). For example, forming an element "over a substrate" can include forming the element directly on the substrate with no intermediate materials/elements therebetween, as well as forming the element indirectly on the substrate with one or more intermediate materials/elements therebetween.

Figure 1A:
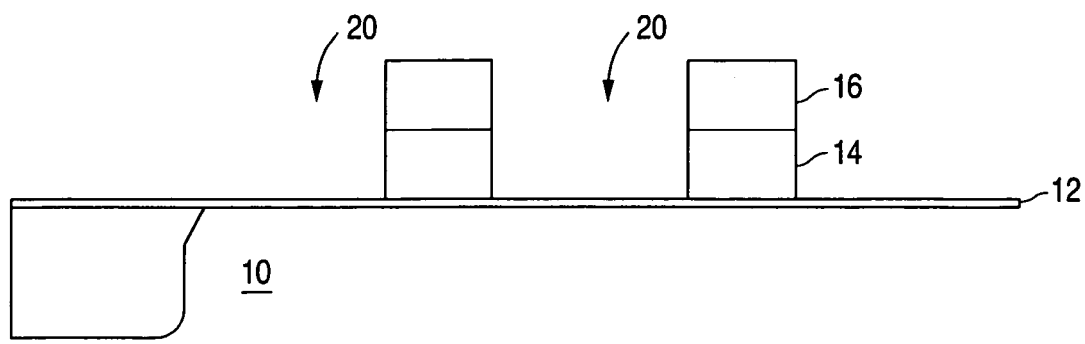
FIGS. 1A to 1H are cross sectional views of a substrate showing in sequence the processing steps used to fabricate the memory cell of the present invention.

FIG. 1A illustrates a cross sectional view of a semiconductor substrate (or substrate well) 10, which is preferably of P conductivity type and is well known in the art. A first layer of insulation material 12, preferably silicon dioxide (hereinafter "oxide"), is formed on the substrate 10 by well known techniques such as oxidation or oxide deposition (e.g. chemical vapor deposition or CVD), having a depth of approximately 30 Å. A layer of polysilicon 14 (hereinafter "poly") is formed on top of oxide layer 12. The formation of poly layer 14 can be made by a well known process such as Low Pressure CVD or LPCVD. The polysilicon is properly doped either through an in-situ method or by conventional implantation. In the preferred embodiment, poly layer 14 has a depth of approximately 1000 Å, and is implanted with As (3.0 E15 dose, 25 KeV implant energy). A second layer of insulation material 16 is formed over the poly layer 14, preferably by an HTO oxide deposition process. A suitable photo-resistant material is then applied on oxide layer 16, and a masking step is performed to selectively remove the photo-resistant material from certain masking regions (stripes 20 extending in a row direction across multiple columns of active regions). Where the photo-resist material is removed, the underlying portions of oxide layer 16 and poly layer 14 are etched away in stripes 20 using standard etching techniques (i.e. anisotropic etch processes). Where the photo resist is not removed, the layers of oxide 16 and poly 14 are maintained. The remaining photo resistant material is removed, to result in the structure shown in FIG. 1A.

Figure 1B:
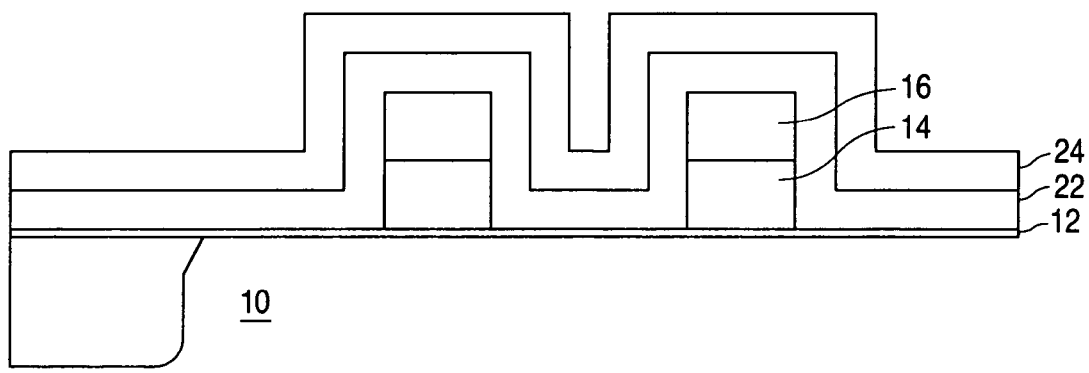
Figure 1C:
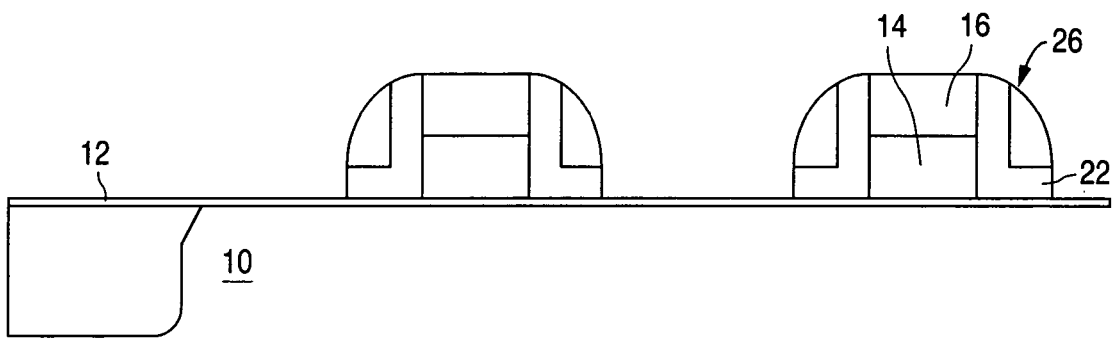

Insulation spacers are then formed along the side wall surfaces of remaining structure. Formation of spacers is well known in the art, and involves the deposition of a material over the contour of a structure, followed by an anisotropic type etch process, whereby the material is removed from horizontal surfaces of the structure, while the material remains largely intact on vertically oriented surfaces of the structure. In the present case, composite spacers are formed as follows. A layer 22 of oxide is formed over the structure, and a layer 24 of silicon nitride ("nitride") is formed over the oxide layer 22, as shown in FIG. 1B. An anisotropic nitride etch is performed, followed by a controlled anisotropic oxide etch, which removes the nitride and most (but preferably not all) of oxide layers 22/24 except for composite spacers 26 (comprising spacer shaped nitride layer 24 over L-shaped oxide layer 22), as shown in FIG. 1C. Damage to the substrate is avoided by not completely removing oxide 12 (and possibly some of oxide 22) over substrate 10 using an anisotropic etch.

Figure 1D:
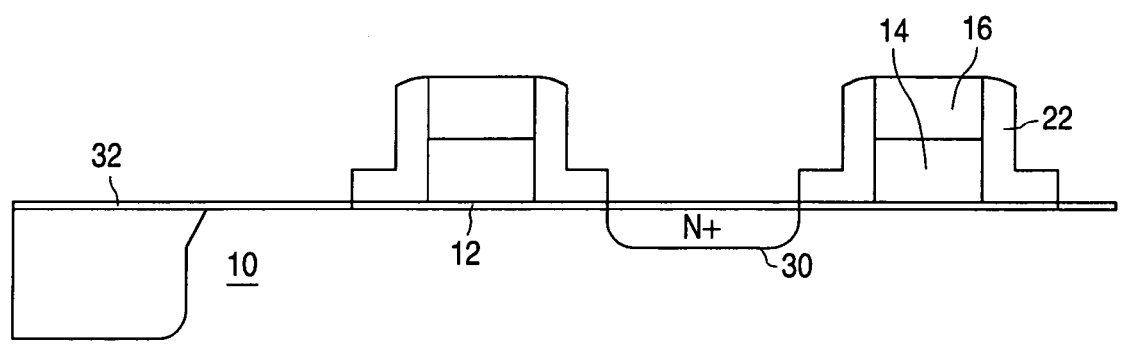

The remaining nitride 24 is removed using a nitride etch. Portions of the structure are masked, and suitable ion implantation is then made across the entire surface of the structure to form first regions (i.e. source regions) 30 in the substrate 10. The source region 30 has a conductivity type (e.g. N doped) that is different from that of the substrate 10 (e.g. P doped). In this case, the source region is N+ doped. A wet etch is next used to remove any exposed oxide 12/22, followed by an oxidation process that forms oxide layer 32 on exposed portions of the substrate. The resulting structure is shown in FIG. 1D.

Figure 1E:
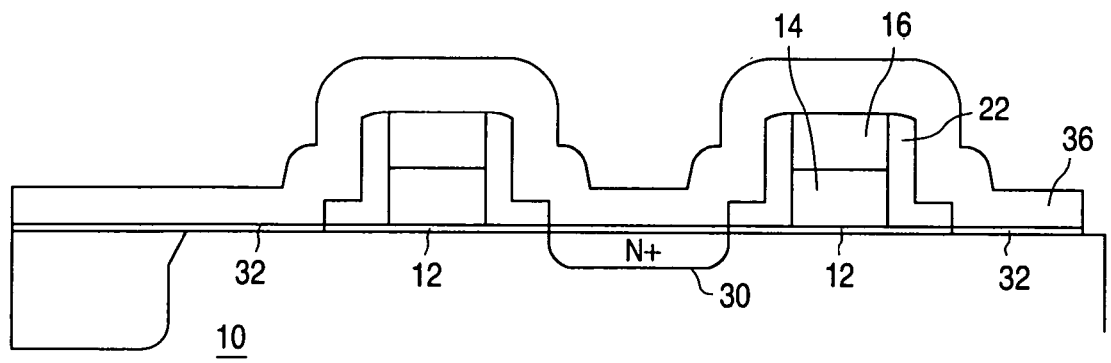
Figure 1F:
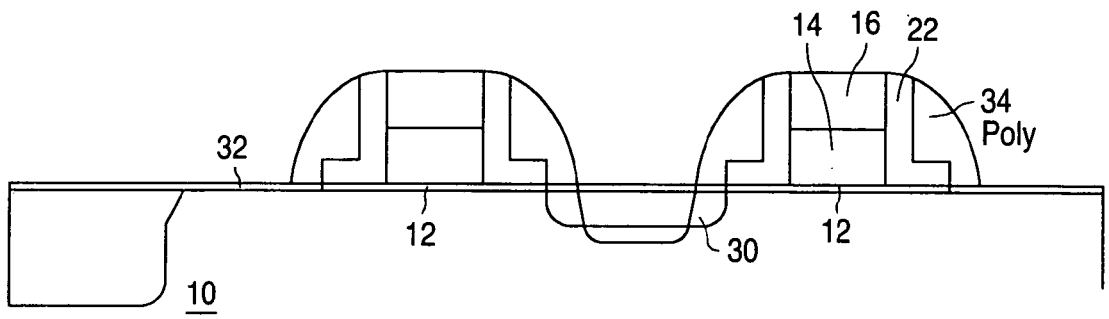

Poly spacers 34 are next formed adjacent the oxide layer 22 by forming a layer of polysilicon 36 over the structure (as shown in FIG. 1E) followed by an anisotropic poly etch leaving poly spacers 34. A suitable implantation step is performed to expand first regions 30 so that they become graded to prevent junction breakdown, as shown in FIG. 1F.

Figure 1G:
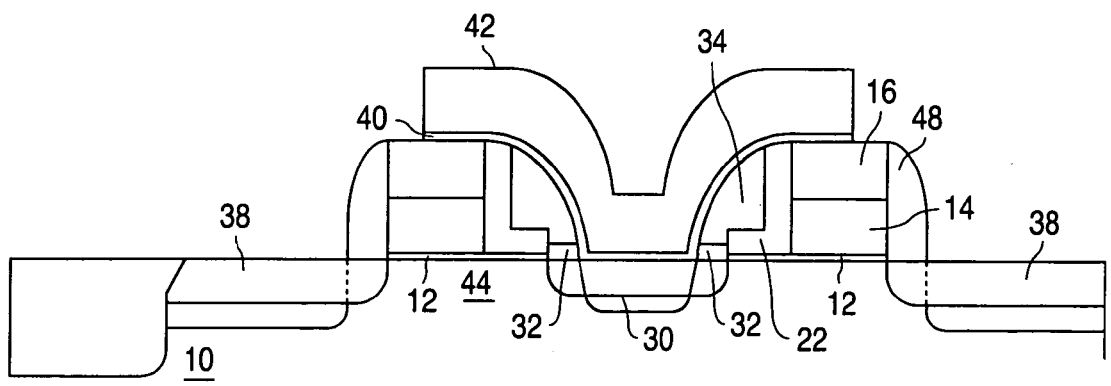
Figure 1H:
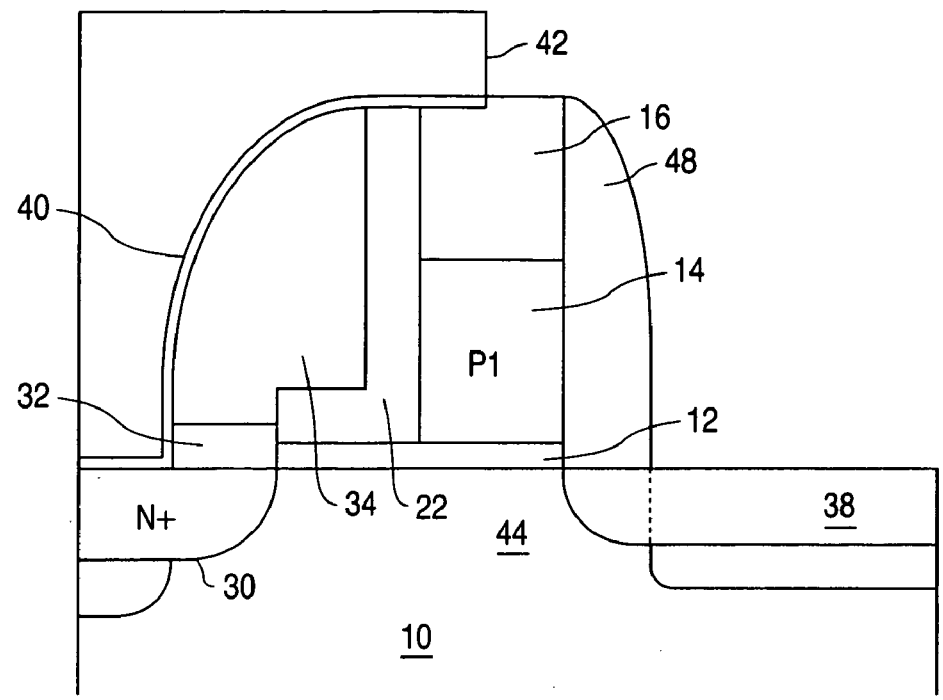

A masking step follows to protect those poly spacers 34 that are disposed adjacent source regions 30. The unprotected poly spacers 34 are then removed using a poly etch step. An oxide etch is then used to remove exposed portions of oxide 22 and 32. An insulation layer 40 is then formed over the structure (e.g. preferably an ONO layer which includes three thin layers of successively deposited insulation materials such as oxide, nitride and oxide, with thicknesses of ~60 Å, ~70 Å, ~60 Å, respectively). A thick layer of polysilicon is then deposited over the structure (~1600 Å). A masking step follows to protect that portion of the deposited polysilicon that is disposed around source regions 30. The unprotected portion of the deposited polysilicon is removed in a poly etch step, leaving poly layer 42 disposed over source region 30 and extending up and over oxide layers 22 and 16. Suitable ion implantation is then made across the structure to form second regions (i.e. drain regions) 38 in the exposed portions of the substrate 10. Insulation spacers 48 are then formed over the substrate adjacent poly/oxide layers 14/16, followed by another ion implantation to expand second regions 38 so that they become graded to prevent junction breakdown. The final structure is shown in FIG. 1G and 1H.

The final structure of the memory cell of the present invention includes a channel region 44 defined in the substrate between the source 30 and drain 38. Poly layer 14 forms the cell's select gate, which is disposed over and insulated from a first portion of the channel region 44. Poly spacer 34 forms the cell's floating gate, which is disposed over and insulated from a second portion of the channel region 44. Poly layer 42 forms the cell's control gate.

Figure 2:
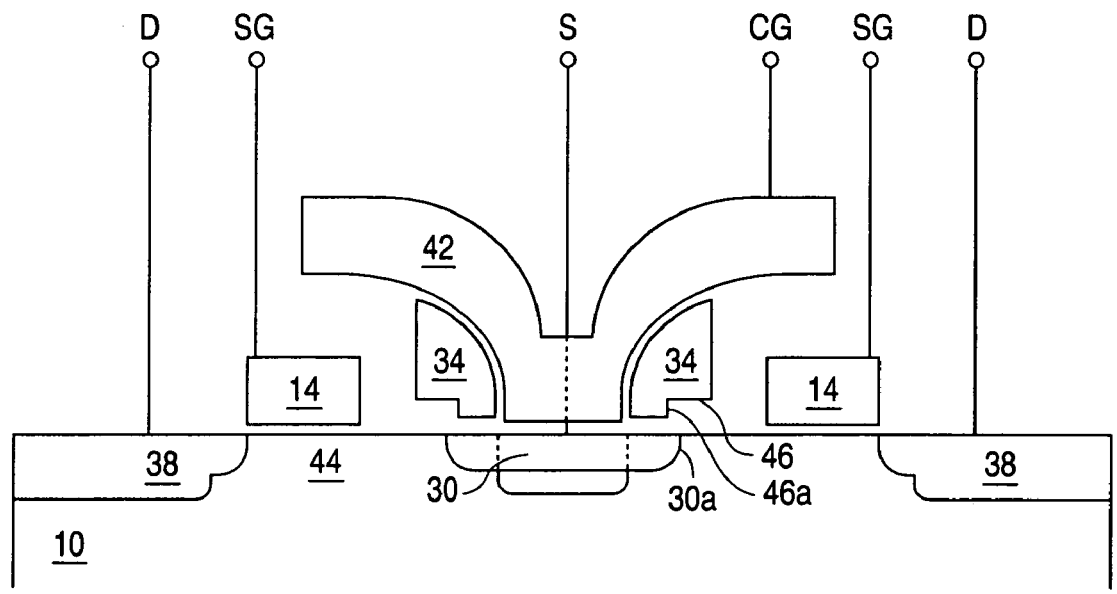
FIG. 2 is a schematic cross sectional view the memory cell of the present invention.

FIG. 2 is a simplified schematic cross sectional view showing the five conductive components of the memory cell (select gate 14, floating gate 34, control gate 42, source 30 and drain 38), which are insulated from each other by one or more layers of insulating materials. The memory cell is controlled by voltages supplied to the select gate 14, control gate 42, source 30, and drain 38 by terminals SEL, CG, S and D, respectively. In the final memory cell structure, the floating gate 34 includes a notch 46 formed therein so that additional (thicker) insulation is formed between the substrate and a portion of the floating gate. The vertical edge 46a of notch 46 is either aligned with the edge 30a of source region 30, or edge 46a is vertically overlapping with source region 30. Thus, source region 30 terminates under the thicker insulation region provided by the notch 46 so that the breakdown voltage of the source junction is increased because the thicker insulation reduces the vertical electric field and the electric field at the source junction edge. To ensure this alignment, thermal annealing can be used to ensure that the source region diffuses underneath oxide layer 22. Alternately, ion implantation that forms source region 30 can be performed just after oxide layer 22 is formed, followed by a second ion implantation after poly spacers 34 are formed (which requires little or no thermal anneal which is beneficial for scaling down to smaller cell sizes). The thicker insulation region provided by the notch 46 will reduced the capacitance between the floating gate spacer 34 and the substrate, which will then increase the coupling ratio of the cell and reduce the high voltage requirement during the erase and program operation.

Memory Cell Operation

The operation of a three poly memory cell is described in U.S. Pat. No. 5,912,843, whose disclosure is incorporated herein by reference.

Memory Cell Erase or Write "1"

To write a "1" or to erase a memory cell 1, which causes the memory cell 1 to be in a conductive state, a high voltage (~12 V) is applied to the source. The drain, select gate and control gate are all at ground potential. Because of the high capacitive couplings between the floating gate and the select gate, and between the floating gate and the control gate, and because of a fairly small capacitive coupling between the source region and the floating gate, and because of the overlap between the source region and the floating gate, a large percentage of the applied voltage appears across the source and floating gate. This causes the electrons to tunnel from the floating gate to the source, but not to the substrate, through the Fowler-Nordheim tunneling mechanism, leaving the floating gate with a relatively positive charge.

With source voltage at 12V, a band-to-band tunneling mechanism may occur at the source junction which will increase the magnitude of the source current. Since an on-chip voltage multiplier is usually used for supplying the high voltage, the band-to-band tunneling current will require a more robust voltage multiplier design.

An alternative way to erase the cell is to apply a negative bias (~−8 to −10 V) to the control gate, while holding the select gate at ground potential or the same negative bias as the control gate, and raise the voltage at the source only to 5 V or close to Vcc, such as 6–7 V. The advantage of this approach is that the source voltage is now at a lower potential. By reducing the source voltage, it allows one to supply the source voltage either directly from the Vcc power supply or from a voltage multiplier with fewer pumping stages for higher current supply capability.

Memory Cell Program or Write "0"

To write a "0" to a memory cell, which causes the memory cell to be in a non-conductive state, a high voltage (~5 to 8 V) is applied to the source. A second high voltage (~10 to 12 V) is applied to the control gate. The drain voltage is kept at 0 V or a small bias voltage (~0.3 to 1.0 volts). A small voltage which is just above the threshold voltage Vt of the transistor under the select gate (e.g. Vt+ΔV where ΔV ~0.1V to 0.5V) is applied to the select gate. The voltage at the select gate causes the transistor to conduct a small current, on the order of micro amperes, from drain to source. Because of the high voltages which are applied the control gate and source region, the potential at the floating gate is coupled high. The high potential of the floating gate will cause the channel region below the floating gate to be pulled high. The surface potential of the substrate immediately below the left edge of the floating gate, is estimated to be about one volt below the floating gate voltage (~8 V). Due to the fact that the select gate is biased to just above the threshold voltage, the channel potential below the select gate is close to that of the drain voltage, which is 0 V or a small bias voltage, as discussed previously. Hence a voltage differential of approximately 8 V is developed across the region in the channel immediately below the select gate and the region in the channel immediately below the floating gate. The width of the gap between the region of the channel immediately below the select gate and the region of the channel immediately below the floating gate is approximately 500 Å. An electric field of 1.5 to 4 MV/cm is thus developed, which is high enough to cause hot electron injection from the channel to the floating gate, which leaves the floating gate negatively charged.

Memory Cell Read

Finally, to read the memory cell, ground potential is applied to the source region. A read voltage of approximately volt is applied to the drain region and a Vcc voltage (e.g. ~1.8 volts for 0.18 µm technology) is applied to the select gate. If the floating gate is positively charged (i.e. the floating gate is discharged of electrons), then the channel region directly underneath the floating gate is turned on. When the select gate is raised to the read potential, the channel region directly under the select gate is also turned on. Thus, the entire channel region will be turned on, causing electrons to flow from the source region to the drain region. This conductive state would be sensed as the memory erased "1" state.

On the other hand, if the floating gate is negatively charged, the channel region directly below the floating gate is either weakly turned on or is entirely shut off. Even when the select gate and the drain region are raised to the read potentials, little or no current will flow through the channel. In this case, either the current is very small compared to that of the "1" state or there is no current at all. This non-conductive state would be sensed as the memory programmed "0" state.

ALTERNATE EMBODIMENT

Figure 3A:
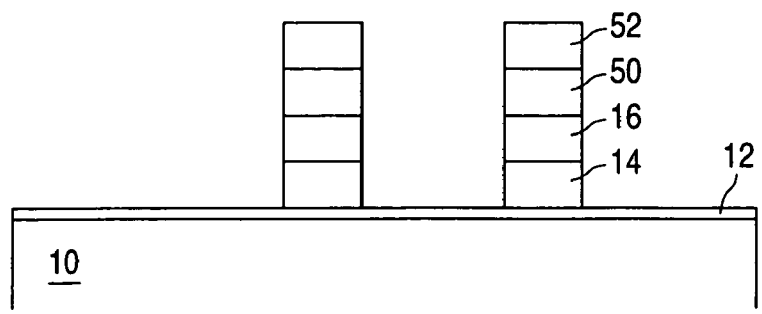
FIGS. 3A to 3C are cross sectional views of a substrate showing in sequence a first alternate embodiment of the processing steps used to fabricate the memory cell of the present invention.
Figure 3B:
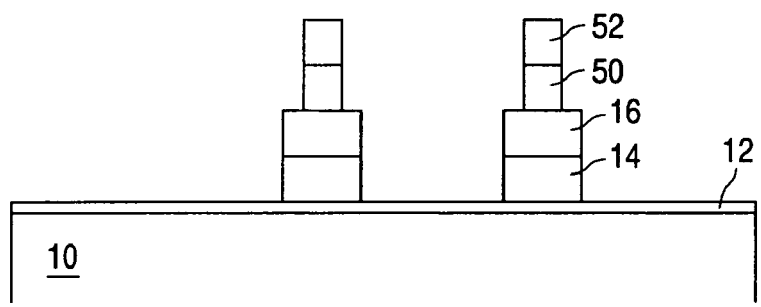
Figure 3C:
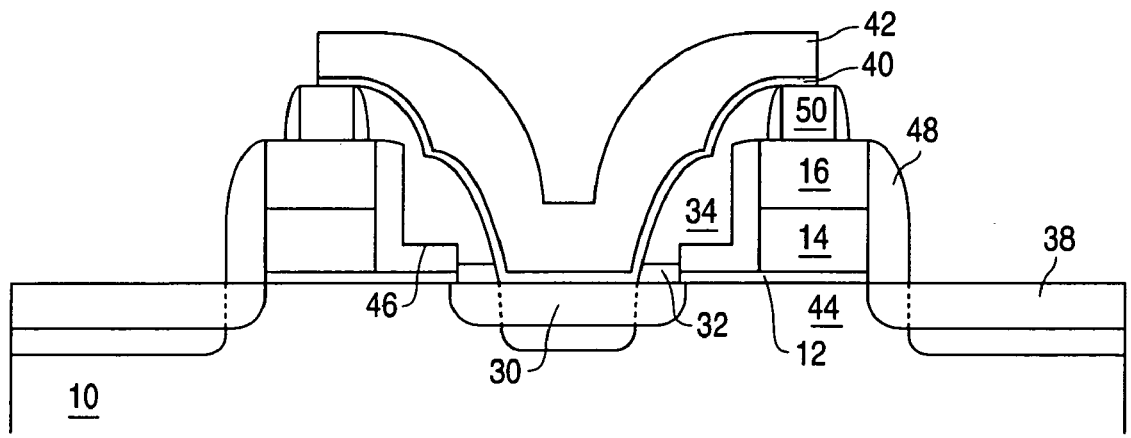

FIGS. 3A to 3C illustrate an alternate embodiment, where the floating gate can be made to extend up and over the select gate for enhanced capacitive coupling. This is accomplished by forming an extra layer of material 50 (e.g. nitride) over oxide 16 in the structure shown in FIG. 1A, and suitable photo-resistant material 52 over layer 50, as shown in FIG. 3A. A plasma etching process (ashing) follows, which removes the exposed surfaces of the photo resist 52. This etching process results in reducing the width of the photo resist 52 (e.g. by about 300 Å), leaving portions of nitride layer 50 exposed. A nitride etch follows to remove the exposed side portions of nitride layer 50 that are no longer protected by the photo resist 52, effectively reducing the width of nitride layer, as shown in FIG. 3B.

After the photo resist 52 is removed, the remaining processing steps described above with respect to FIGS. 1B to 1H are performed to result in the structure shown in FIG. 3C. With this embodiment, there is enhanced coupling between the control gate and the floating gate, combined with the notch 46 for greater breakdown voltage.

SECOND ALTERNATE EMBODIMENT

Formation of a notch in the floating gate for increased insulation between the floating gate and the edge of the source region is not limited to floating gates formed as spacers. For example, U.S. Pat. No. 6,057,575 (the '575 patent), which is incorporated herein by reference, illustrates the formation of the floating gate as a layer of material. As shown in FIG. 1a of the '575 patent, insulation material is formed over and adjacent a select gate, and the floating gate is formed over the insulation material. This embodiment can be modified to include the formation of a notch in the floating gate to increase the breakdown voltage of the device.

Figure 4A:
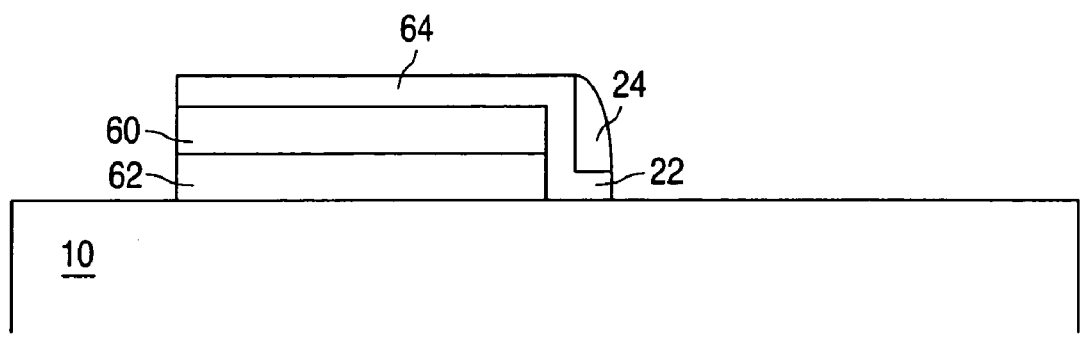
FIGS. 4A to 4C are cross sectional views of a substrate showing in sequence a second alternate embodiment of the processing steps used to fabricate the memory cell of the present invention.
Figure 4B:
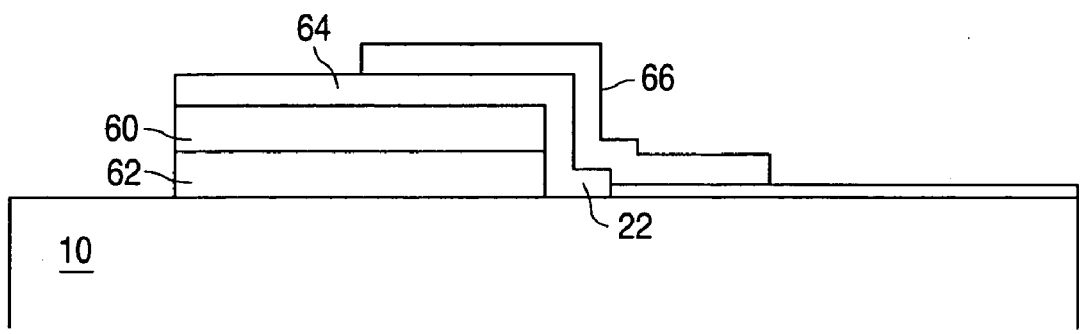
Figure 4C:
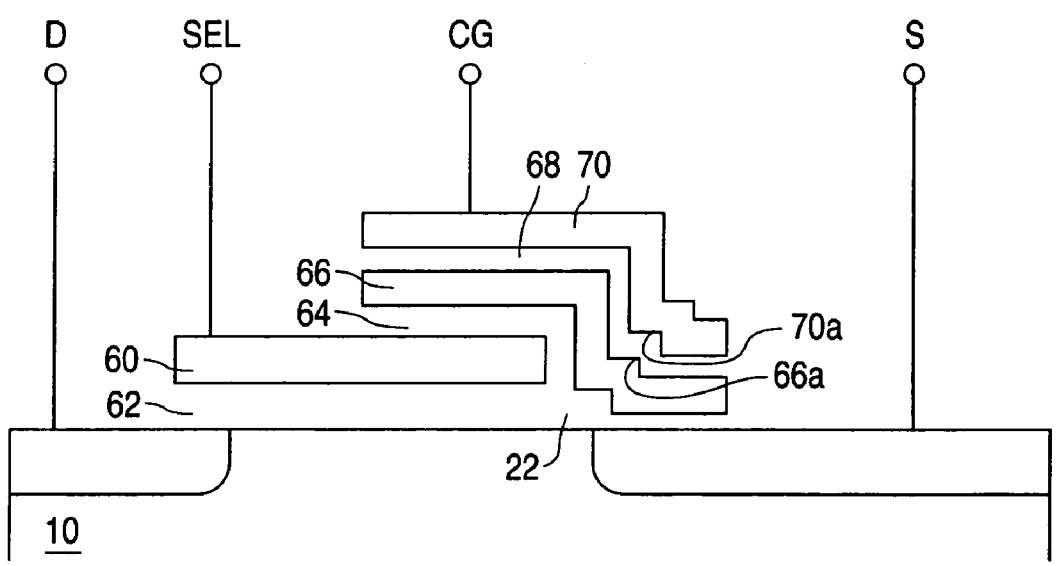

FIGS. 4A to 4C illustrate the modification to the embodiment of FIG. 1a of the '575 patent. After the select gate 60 is formed over an insulation layer 62, an insulation layer 64 is formed over the structure, including an L-shaped portion thereof laterally adjacent to layers 60/62. Nitride spacer 24 is then formed adjacent the L-shaped portion 22 of layer 64 in the same manner described above, and as illustrated in FIG. 4A. After the nitride 24 is removed, a layer of insulation material 64 is formed over the structure, followed by the formation of the floating gate 66 over the insulation material 64, as shown in FIG. 4B. Another insulation layer 68 and the control gate 70 are then formed according to the processing steps described in the '575 patent, resulting in the final structure shown in FIG. 4C. Floating gate 66 includes a protrusion 66a that faces a notch 70a in the lower surface of control gate 70.

THIRD ALTERNATE EMBODIMENT

Figure 5A:
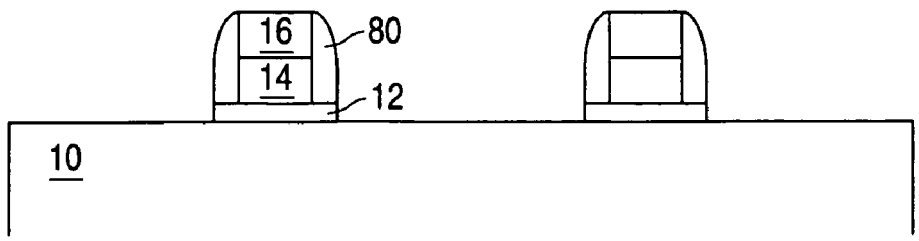
FIGS. 5A to 5D are cross sectional views of a substrate showing in sequence a third alternate embodiment of the processing steps used to fabricate the memory cell of the present invention.
Figure 5B:
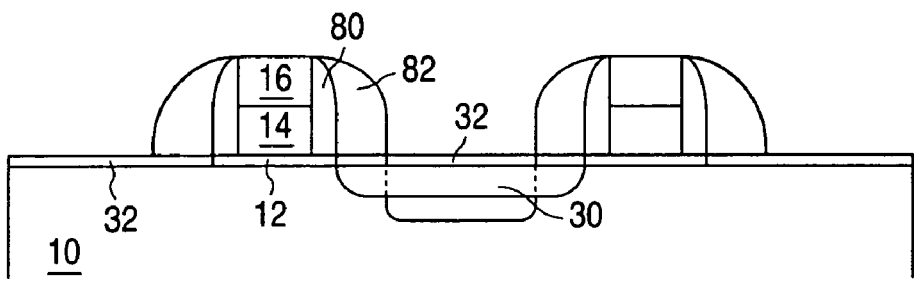
Figure 5C:
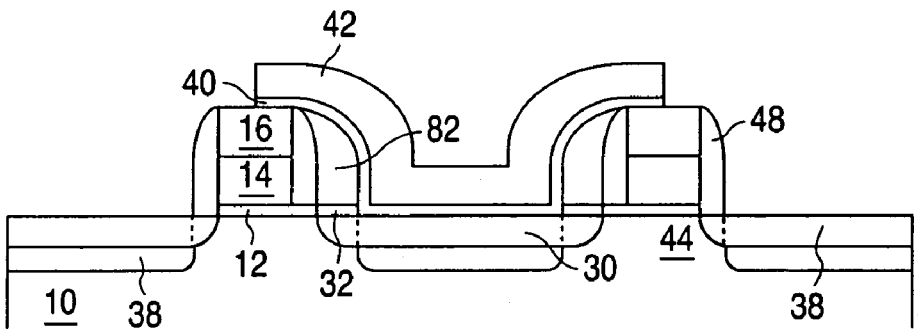

FIGS. 5A to 5D illustrate a third alternate embodiment, where the notch 46 is not formed in the floating gate, and instead the floating gate is completely disposed over the source region. Starting with the structure shown in FIG. 1A, insulation spacers 80 are formed laterally adjacent to poly 14 and oxide 16 (by insulation deposition and etch using oxide 16 as an etch stop), as illustrated in FIG. 5A. Oxide layer 32 is formed over the exposed portions of the substrate, preferably by oxidation. Suitable ion implantation is used to form the first (source) regions 30. Then, poly spacers 82 are formed laterally adjacent to insulation spacers 80 (by poly deposition and etch). A second ion implantation is performed to expand first regions 30 so that they become graded to prevent junction breakdown, as shown in FIG. 5B. The remaining processing steps described above with respect to FIG. 1G are performed to complete the structure, which is shown in FIG. 5C.

Figure 5D:
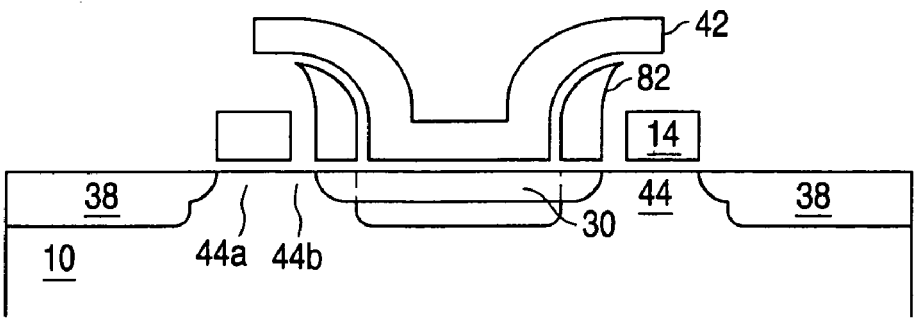

FIG. 5D shows the conductive elements of the final structure, where the floating gate 82 is disposed over the source region, a first portion 44a of the channel region 44 is vertically overlapped (and controlled) by select gate 14, and a second portion 44b of channel region 44 is laterally offset from, and not vertically overlapped by, floating gate 82. However, floating gate 82 can exert enough control over second portion 44b (i.e. via fringing field) to turn channel region second portion 44b on (conductive) and off (non-conductive). This embodiment is advantageous for those applications where there is a limit on the voltage that can be applied to the source region.

FOURTH ALTERNATE EMBODIMENT

Figure 6A:
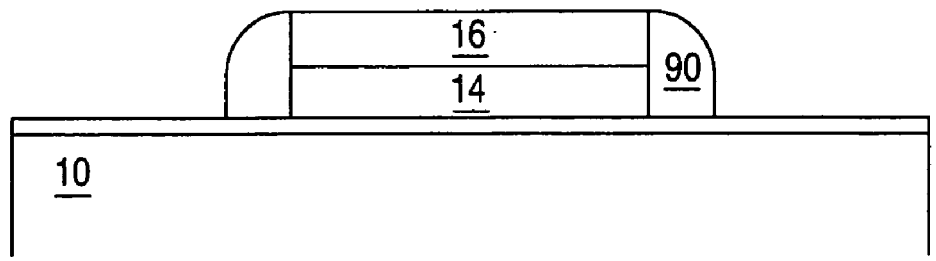
FIGS. 6A to 6C are cross sectional views of a substrate showing in sequence a fourth alternate embodiment of the processing steps used to fabricate the memory cell of the present invention.
Figure 6B:
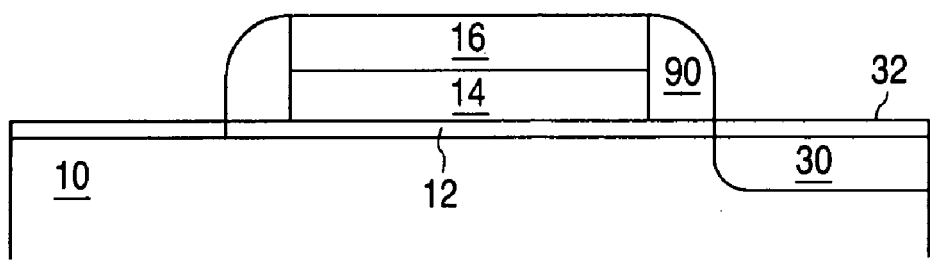
Figure 6C:
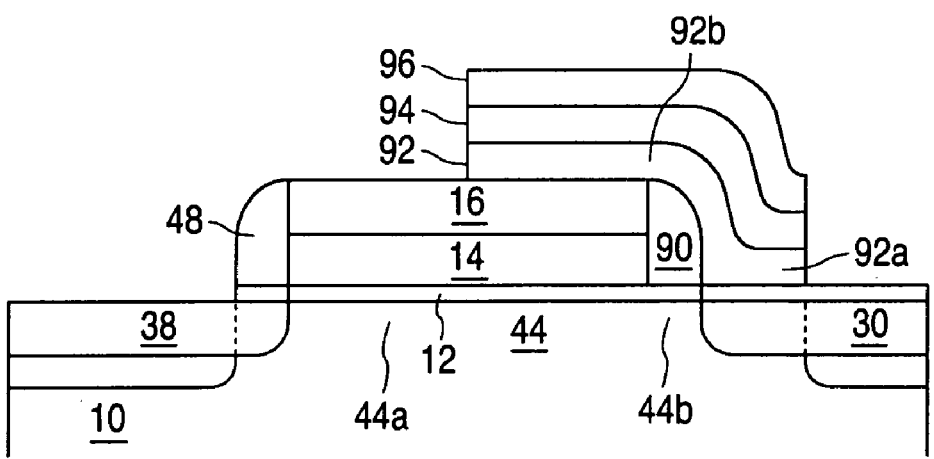

FIGS. 6A to 6C illustrate a fourth alternate embodiment, which is similar to the third alternate embodiment, but where a non-spacer floating gate has a lower portion completely disposed over the source region. Starting with the structure shown in FIG. 1A (but with wider poly/oxide layers 14/16), insulation spacers 90 are formed laterally adjacent to poly 14 and oxide 16 (by insulation deposition such as nitride, follow by an etch using oxide 16 as an etch stop), as illustrated in FIG. 6A. An oxide etch is used to remove exposed portions of oxide layer 12, followed by the formation of oxide layer 32 over the exposed portions of the substrate, preferably by oxidation. Suitable ion implantation is used to form the first (source) regions 30, as shown in FIG. 6B. Then, a poly layer 92 is formed over the structure, followed by an insulation layer 94 formed over poly layer 92, followed by a poly layer 96 formed over insulation layer 94. After a suitable masking step, and a poly/insulation etch to align the ends of poly layer 92/96, a second ion implantation is performed to expand first regions 30 to prevent voltage breakdown. Drain regions 38 is formed in a similar manner as described above, resulting in the structure shown in FIG. 6C.

Layer 92 constitutes the floating gate, and layer 96 constitutes the control gate. The floating gate 92 has a lower portion 92a that extends over oxide layer 32 and source region 30. Only an upper portion 92b of floating gate 92 is not vertically over the source region 30. However, floating gate lower portion 92a can exert enough control over that portion 44b of channel region directly under insulation spacer 90 (i.e. via fringing field) to turn channel region portion 44b on (conductive) and off (non-conductive).

It is to be understood that the present invention is not limited to the embodiment(s) described above and illustrated herein, but encompasses any and all variations falling within the scope of the appended claims. For example, materials, processes and numerical examples described above are exemplary only, and should not be deemed to limit the claims. Further, as is apparent from the claims and specification, not all method steps need be performed in the exact order illustrated or claimed, but rather in any order that allows the proper formation of the nonvolatile memory cell of the present invention. Lastly, single layers of material could be formed as multiple layers of such or similar materials, and vice versa.

What is claimed is:

1. An electrically erasable and programmable memory device comprising:
   a substrate of semiconductor material of a first conductivity type;
   spaced-apart first and second regions formed in the substrate and having a second conductivity type different from the first conductivity type, with a channel region therebetween;
   a conductive select gate formed over and insulated from a first portion of the channel region;
   a conductive floating gate having a bottom surface disposed over and insulated from the first region and a second portion of the channel region by insulation material, wherein a notch is formed in the bottom surface having an edge that is aligned with an edge of the first region or that is disposed over the first region; and
   a conductive control gate having a first portion disposed adjacent to the floating gate.

2. The device of claim 1, wherein the floating gate includes a first portion disposed over the notch and a second portion not disposed over the notch, and wherein a portion of the insulation material insulating the floating gate first portion from the substrate has a thickness greater than that of a portion of the insulation material insulating the floating gate second portion from the substrate.

3. The device of claim 2, wherein the floating gate includes a third portion that extends up and over the select gate.

4. The device of claim 1, wherein the floating gate is formed as a spacer over the insulation material.

5. The device of claim 1, wherein the control gate first portion is disposed laterally adjacent to the floating gate, and wherein the control gate includes a second portion that extends up and over the floating gate.

6. The device of claim 5, wherein the control gate first portion is disposed directly on insulation material that is disposed directly on the first region, and the control gate second portion is disposed directly on insulation material that is disposed directly on the floating gate.

7. The device of claim 5, wherein:
   the floating gate includes a protrusion on a top surface of the floating gate;
   the control gate includes a bottom surface in which a second notch is formed;
   the floating gate protrusion faces and is insulated from the second notch.

8. The device of claim 2, wherein the notch edge includes a portion of the floating gate bottom surface that is generally orthogonal to a surface of the substrate.

9. An electrically erasable and programmable memory device comprising:
   a substrate of semiconductor material of a first conductivity type;
   spaced-apart first and second regions formed in the substrate and having a second conductivity type different from the first conductivity type, with a channel region therebetween, wherein the channel region includes a first portion adjacent the first region and a second portion adjacent the second region;
   a conductive select gate formed over and insulated from the channel region second portion for controlling a conductivity of the channel region second portion;
   a conductive floating gate having a first portion disposed entirely over and insulated from the first region for generating fringing fields that control a conductivity of the channel region first portion, wherein the floating gate first portion including a bottom surface disposed entirely over and insulated from the first region and a side surface extending from the bottom surface and away from the substrate; and
   a conductive control gate having a first portion disposed adjacent to the floating gate.

10. The device of claim 9, wherein the side surface is aligned with an edge of the first region.

11. The device of claim 9, wherein the floating gate is disposed entirely over the first region.

12. The device of claim 9, wherein the floating gate is formed as a spacer.

13. The device of claim 9, wherein the control gate first portion is disposed laterally adjacent to the floating gate, and wherein the control gate includes a second portion that extends up and over the floating gate.

14. The device of claim 9, wherein the floating gate side surface is generally orthogonal to a surface of the substrate.

* * * * *